US012087625B2

(12) United States Patent
Hou et al.

(10) Patent No.: US 12,087,625 B2
(45) Date of Patent: Sep. 10, 2024

(54) APPARATUS AND METHODS FOR DETERMINING HORIZONTAL POSITION OF SUBSTRATE USING LASERS (71) Applicant: TAIWAN SEMICONDUCTOR MANUFACTURING COMPANY, LTD., Hsinchu (TW)

(72) Inventors: Kuo-Lung Hou, Taichung (TW); Ming-Hsien Lin, Taichung (TW); Che-I Kuo, Hsinchu (TW); Yung Hsin Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/865,320

(22) Filed: Jul. 14, 2022

(65) Prior Publication Data
US 2022/0352021 A1   Nov. 3, 2022

Related U.S. Application Data (62) Division of application No. 17/232,083, filed on Apr. 15, 2021.

(51) Int. Cl.
*C25D 17/00* (2006.01)
*C25D 3/38* (2006.01)
*C25D 5/02* (2006.01)
*H01L 21/768* (2006.01)

(52) U.S. Cl.
CPC .......... *H01L 21/76873* (2013.01); *C25D 3/38* (2013.01); *C25D 5/02* (2013.01)

(58) Field of Classification Search
None
See application file for complete search history.

(56) References Cited

U.S. PATENT DOCUMENTS

| | | | |
|---|---|---|---|
| 7,837,841 B2 | 11/2010 | Chen et al. | |
| 9,632,498 B2 | 4/2017 | Chang et al. | |
| 2003/0183611 A1 | 10/2003 | Gregor et al. | |
| 2004/0206628 A1 | 10/2004 | Lubomirsky et al. | |
| 2012/0100709 A1 | 4/2012 | Minami | |
| 2012/0327428 A1 | 12/2012 | Hellwig et al. | |
| 2016/0222537 A1 | 8/2016 | Shen et al. | |
| 2016/0348264 A1 | 12/2016 | Fujikata et al. | |

(Continued)

OTHER PUBLICATIONS

Non-Final Office Action issued in U.S. Appl. No. 17/232,083, dated Jan. 31, 2022.

(Continued)

*Primary Examiner* — Stefanie S Wittenberg
(74) *Attorney, Agent, or Firm* — STUDEBAKER & BRACKETT PC (57) ABSTRACT An apparatus for electroplating includes a cup configured to support a substrate, and a cone including at least three distance measuring devices arranged on a lower surface thereof and facing the substrate. Each distance measuring device is configured to transmit a laser pulse towards the substrate, the laser pulse impinging the substrate, receive a reflected laser pulse from the substrate, calculate a turn-around time of the laser pulse, and calculate a distance between the distance measuring device and the substrate using the turnaround time for determining an inclination of the substrate.

20 Claims, 6 Drawing Sheets (56) References Cited

U.S. PATENT DOCUMENTS

2016/0363667 A1* 12/2016 Ishikawa ................. G01S 7/486
2017/0009370 A1    1/2017 Chua et al.
2019/0181026 A1    6/2019 Yamakawa et al.
2019/0186039 A1    6/2019 Fujikata

OTHER PUBLICATIONS

Non-Final Office Action issued in U.S. Appl. No. 17/232,083, dated Mar. 6, 2023.

* cited by examiner

APPARATUS AND METHODS FOR DETERMINING HORIZONTAL POSITION OF SUBSTRATE USING LASERS

CROSS-REFERENCE TO RELATED APPLICATIONS

This application is a divisional application of U.S. non-provisional patent application Ser. No. 17/232,083 filed on Apr. 15, 2021, the entire contents of which are incorporated herein by reference.

BACKGROUND

Recent advances in semiconductor fabrication and processing has led to increased use of electroplating to deposit a variety of materials on semiconductor devices. Such materials include electroplated copper, nickel, and tin-silver alloys. In electroplating, the substrate is placed in the cup of a substrate holder assembly (implemented as a clamshell assembly).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In order to increase signal speed performance in integrated circuits, copper, gold and silver or alloys thereof are being used with increasing frequency for interconnects because of their lower resistance compared to, for example, aluminum. In addition to possessing lower resistance compared to aluminum, copper possesses superior migration and exhibits higher reliability. The techniques used to achieve copper metallization include CVD, selective electroless deposition, sputtering (PVD) and electro-chemical plating.

Semiconductor device fabrication is a multiple-step sequence of photo lithographic and chemical processing steps during which electronic circuits are gradually created on a wafer made of pure semiconducting material. Among semiconductor fabrication processes, layer deposition processes are utilized to form IC components. One of the employed layer deposition process is an electrochemical plating (ECP) process, which deposits a layer of conductive material (e.g., gold, zinc nickel, silver, copper or nickel) onto a substrate (e.g., semiconductor wafer) by electrolytic deposition. In electrochemical plating (ECP) processes, a substrate is submerged into an plating solution comprising ions of a material to be deposited. A DC voltage is applied to the substrate, causing it to act as a cathode which attracts cations of the plating solution, which are reduced and accumulated over the substrate to form a thin film onto the substrate.

The electrochemical deposition of copper (or any other conductive material to be deposited) is caused by the passage of electrical current between two electrodes through a copper sulfate solution or other copper containing electrolytes. The electrical current to the electrode is electronic, while the current in the electrolyte is ionic. At the cathode, electrochemical reduction occurs, while electrochemical oxidation occurs at the anode which is made of the conductive material (copper, in this case) that is to be deposited/plated onto the substrate. In this arrangement, copper ions removed at the cathode are replaced by copper ions produced at the anode. Copper ions are transported to the cathode by electrical drift, diffusion and convection. The required voltage necessary to pass a certain current is the sum of ohmic drop in the electrolyte, the surface over potential across the double layer and the concentration over potential associated with the diffusion layer. Electro-chemical plating can be carried out at constant current, constant voltage or variable forms of current or voltage. The distribution of current, and hence the distribution of the thickness of the copper layer across the cathode depends on its geometry, the kinetics of the electrochemical reaction and concentration variations, as determined by the hydrodynamics and the convective mass transport in the electrolyte.

In the case of copper electro-chemical plating on silicon wafer, the $SiO_2$-covered wafer is at least partially coated with a thin conductive layer of copper, normally referred to as a seed layer, in order to assure electronic conductivity. The wafer is exposed to an electrolyte containing copper ions and electrical contact is established between the seed layer and the power supply by several contact points along the periphery of the wafer. Constant current is passed for a certain length of time, resulting in a corresponding thickness of copper layer.

Figure 1A:
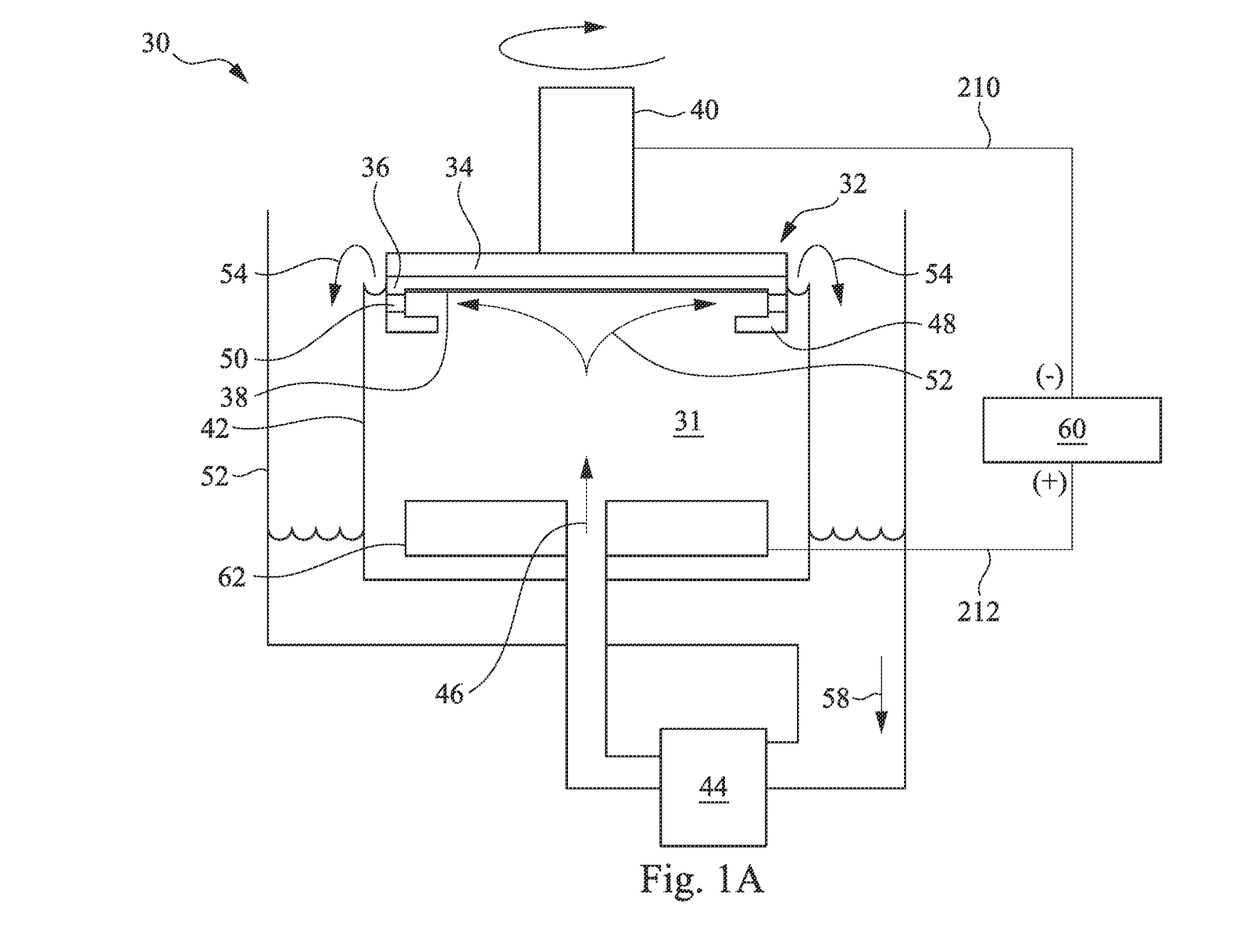
FIG. 1A is a schematic view of an electrochemical plating apparatus including a wafer.

FIG. 1A is a schematic view of an electrochemical plating apparatus 30 including a substrate 38. The electrochemical plating apparatus 30 includes a substrate holder 32 mounted on a rotatable spindle 40 which allows rotation of the substrate holder 32. The substrate holder 32 includes a cone 34, a cup 36 and a flange 48, and apertures 50. Before the electrochemical plating process starts, the substrate 38 is mounted in the cup 36. The substrate holder 32 and the substrate 38 are then placed into an electroplating cell 42 that serves as a container/vessel for containing a plating solution 31, e.g., a copper sulfate ($CuSO_4$) solution. As indicated by arrow 46, the plating solution 31 is continually provided to the electroplating cell 42 by a pump 44. The plating solution 31 flows upwards towards the substrate 38 and then radially outward and across the substrate 38 and then flow through the apertures 50 as indicated by arrows 52. By directing the plating solution 31 towards the substrate 38 (e.g., towards the center of the substrate 38), any gas bubbles entrapped on the substrate 38 are removed through the apertures 50. In some embodiments, the plating solution 31 overflows from the electroplating cell 42 to an overflow reservoir 56 as indicated by arrows 54. The plating solution 31 is then filtered and returned to pump 44 as indicated by arrow 58 completing a recirculation of the plating solution 31.

The plating solution 31 may include a mixture of copper salt, acid, water and various organic and inorganic additives that improve the properties of the deposited copper. Suitable copper salts for the plating solution 31 include comprise copper sulfate, copper cyanide, copper sulfamate, copper chloride, copper formate, copper fluoride, copper nitrate, copper oxide, copper fluorine-borate, copper trifluoroacetate, copper pyrophosphate and copper methane sulfonate, or hydrates of any of the foregoing compounds. The concentration of the copper salt used in the plating solution will vary depending on the particular copper salt used. Various acids can be used in the plating solution 31, comprising: sulfuric acid, methanesulfonic acid, fluoroboric acid, hydrochloric acid, hydroiodic acid, nitric acid, phosphoric acid and other suitable acids. The concentration of the acid used will vary depending on the particular acid used in the plating solution 31. Common additives for copper plating solution include brighteners, suppressors and levelers. Brighteners are organic molecules that tend to improve the specularity (or reflectivity) of the copper deposit by reducing both surface roughness and grain-size variation. Suitable brighteners include, for example, organic sulfide compound, such as bis-(sodium sulfopropyl)-disulfide, 3-mercapto-1-propanesulfonic acid sodium salt, N-dimethyl-dithiocarbamyl propylsulfonic acid sodium salt and 3-S-isothiuronium propyl sulfonate, or mixtures of any of the foregoing compounds. Suppressors are macromolecule deposition inhibitors that tend to adsorb over the surface of the substrate and reduce local deposition rates, increasing the deposition uniformity. Levelers usually have ingredients with nitrogen functional group and may be added to the plating solution at a relatively low concentration. Traditional leveling involves the diffusion or migration of strongly current suppressing species to corners or edges of macroscopic objects which otherwise plate more rapidly than desired due to electric field and solution mass transfer effects. The levelers may be selected from the following agents: a polyether surfactant, a non-ionic surfactant, a cationic surfactant, an anionic surfactant, a block copolymer surfactant, a polyethylene glycol surfactant, polyacrylic acid, a polyamine, aminocarboxylic acid, hydrocarboxylic acid, citric acid, entprol, edetic acid, tartaric acid, a quaternized polyamine, a polyacrylamide, a cross-linked polyamide, a phenazine azo-dye, an alkoxylated amine surfactant, polymer pyridine derivatives, polyethyleneimine, polyethyleneimine ethanol, a polymer of imidazoline and epichlorohydrine, benzylated polyamine polymer.

The substrate 38 and an anode 62 are both immersed in the plating solution 31 ($CuSO_4$ solution) containing one or more dissolved metal salts as well as other ions that permit the flow of electricity. The substrate 38 acts as a cathode onto which material is deposited derived from the anode 62 disposed within the electroplating cell 42. A DC power supply 60 has a negative output lead 210 electrically connected to the substrate 38 through one or more slip rings, brushes and contacts (not shown). The positive output lead 212 of the power supply 60 is electrically connected to the anode 62. During use, power supply 60 biases the substrate 38 to have a negative potential relative to the anode 62 causing an electrical current to flow from the anode 62 to the substrate 38. (As used herein, electrical current flows in the same direction as the net positive ion flux and opposite the net electron flux.) This causes an electrochemical reaction (e.g. $Cu^{++}+2e^-=Cu$) on the substrate 38 which results in the deposition of the electrically conductive layer (e.g. copper, in this case) on the substrate 38. The ion concentration of the plating solution is replenished during the plating cycle by dissolving anode 62 which comprises, for example, a metallic compound (e.g. $Cu=Cu^{++}+2e^-$).

Figure 1B:
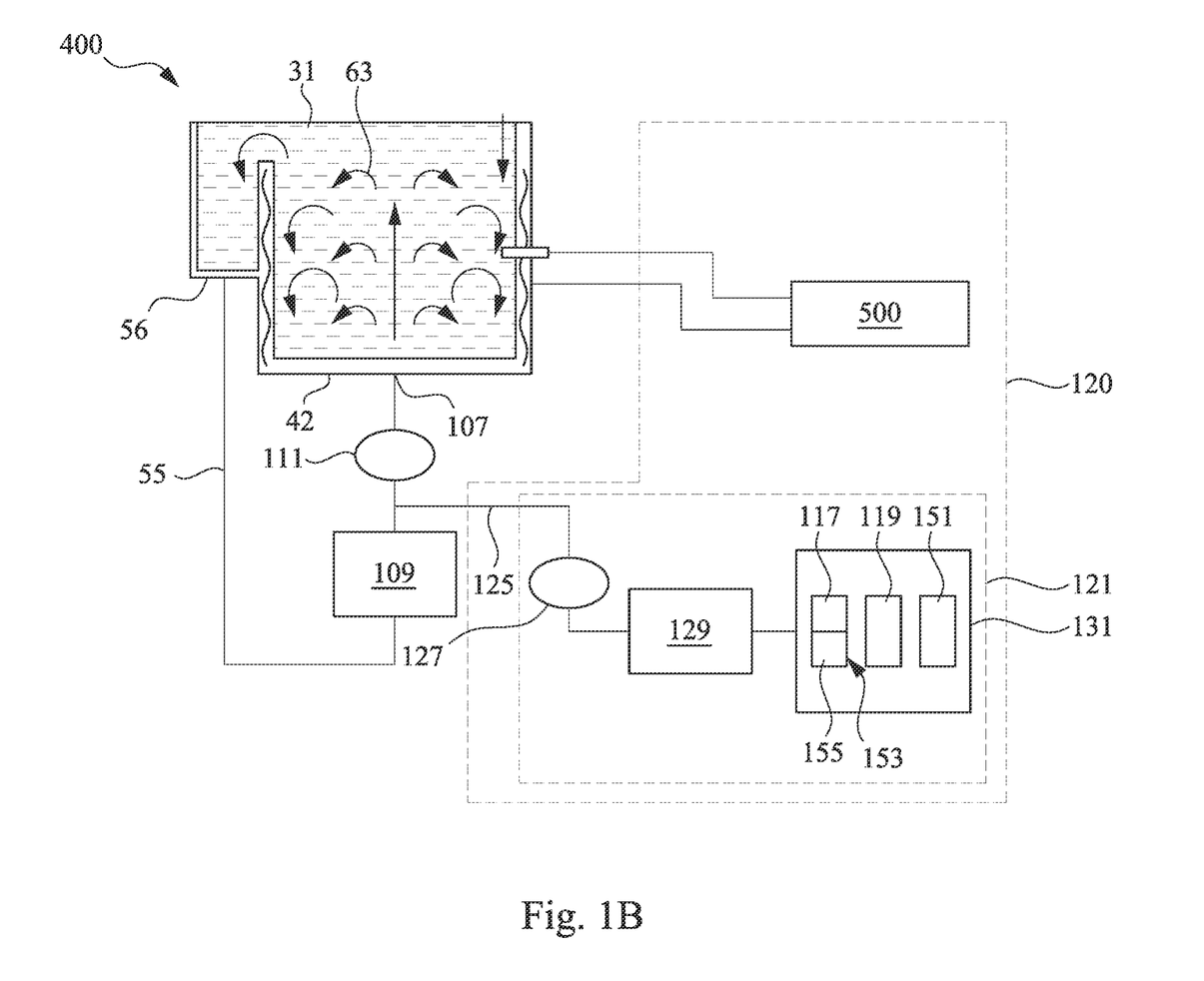
FIG. 1B is a schematic view of a processing system including the electrochemical plating apparatus of FIG. 1A.

FIG. 1B is a schematic view of a processing system 400 that may be utilized with the electrochemical plating apparatus 30 in FIG. 1A to bring the substrate 38 into contact with the plating solution 31. Referring to FIG. 1B, with continued reference to FIG. 1A, the electroplating cell 42 holds the plating solution 31 and the substrate 38 is immersed into the plating solution 31. As such, the electroplating cell 42 is sized based at least in part upon the size of the substrate 38 that will be processed.

In order to maintain circulation (represented the curved arrows labeled 63) within the electroplating cell 42, which circulation helps to mix the plating solution 31 and aid in the replenishment of the plating solution 31 adjacent to the surface of the substrate 38, the electroplating cell 42 may additionally have an overflow reservoir 56. The overflow reservoir 56 is positioned to receive the plating solution 31 after the plating solution 31 has entered the electroplating cell 42 (e.g., through an entry port 107 at the bottom of the electroplating cell 42) and has circulated through the electroplating cell 42 before entering the overflow reservoir 56. As such, the overflow reservoir 56 may be a weir located adjacent to a top of the electroplating cell 42 so that plating solution 31 can enter the bottom of the electroplating cell 42, circulate around the electroplating cell 42, and make its way up through the electroplating cell 42 before overflowing a side of the electroplating cell 42 and entering the overflow reservoir 56.

The overflow reservoir 56 is connected to the recirculation line 55. The recirculation line 55 receives the plating solution 31 from the overflow reservoir 56 and recirculates the plating solution 31 from the overflow reservoir 56 back to the electroplating cell 42. The recirculation line 55 has a first pump 109 that is utilized to pump the plating solution 31 back into the electroplating cell 42 through, e.g., the entry port 107. The first pump 109 also helps to provide the forces that aid in the mixing of the plating solution 31 within the electroplating cell 42.

The recirculation line 55 may also comprise a filter 111. The filter 111 is used to remove particulate materials and other impurities from the plating solution 31 as the plating solution 31 recirculates within the processing system 400. These impurities may include silicate, aggregation surfactant, the oil drop by-products of the plating solution 31, and other particles that may form during the processing reactions or else otherwise be in the plating solution 31. The filter 111 may be sized, for example, to capture the impurities such as the silicate, the aggregation surfactant, and the oil drop by-products and, as such, may be dependent at least in part upon the size of these impurities.

The recirculation line 55, first pump 109, and filter 111 provides a desired recirculation rate of the plating solution 31 to the electroplating cell 42. This recirculation rate may be used to ensure that the plating solution 31 is properly mixed so that variations of concentrations (that result from the chemical reactions) at different points within the plating solution 31 are kept at a minimum.

As the process continues, the reactants within the plating solution 31 (e.g., the strong base, the surfactant, and the oxidant) will react and their concentrations will reduce while concentrations of by-products of the reactions (such as silicate) will increase, thereby changing the various rates of reaction and introducing undesired complexities in attempts to control the processing process. In order to reduce the effects of this reduction, a replenishment system 120 is utilized to monitor the concentrations of the individual components and, if necessary, to replenish the individual components within the plating solution 31 in order to maintain better control over the processing process. In an embodiment, the replenishment system 120 includes a monitoring system 121 and a controller 500.

The monitoring system 121 is connected to the recirculation line 55 with a bypass line 125 connected between the first pump 109 and the filter 111. To obtain samples of the plating solution 31, a first valve 127 is installed in the bypass line 125 and utilized to remove samples of the plating solution 31 from the recirculation line 55 for analysis. The first valve 127 receives a signal from the controller 500 to open and take a sample at regular intervals.

To obtain the desired cooling, a cooler 129 is, e.g., a continuous flow heat exchanger with a cooling medium such as cooling water in order to get the samples of the plating solution 31 to a constant temperature. Alternatively, the cooler 129 is an active cooling unit, e.g., a refrigeration unit to provide the desired cooling to the samples of the plating solution 31. Any suitable system and method of reducing the temperature of the sample of the plating solution 31 and maintaining the temperature of the samples of the plating solution 31 is utilized, without departing from the scope of the embodiments.

Once the samples of the plating solution 31 have been cooled down to the appropriate temperature, the samples of the plating solution 31 can be analyzed by a measurement unit 131. The measurement unit 131 includes one or more analysis units, with each of the analysis units utilized to measure one or more components of the plating solution 31. For example, a first analysis unit 117 may analyze the concentration of the oxidant, a second analysis unit 119 may analyze a concentration of the surfactant, and a third analysis unit 151 may analyze a concentration of the strong base.

The first analysis unit 117 used to measure the oxidant within the samples of the plating solution 31 further includes multiple measuring units, with each one of the individual different measuring units measuring different ranges of concentrations that the oxidant is at. For example, for measuring relatively higher concentrations of the oxidant, the first analysis unit 117 includes an intensity unit 153 that measures, e.g., an oxidation-reduction potential (ORP) of the samples of the plating solution 31. Alternatively, the intensity unit 153 is a pH measurement unit, which measures the pH of the samples of the plating solution 31. Either type of intensity unit 153 (e.g., that measures either ORP or pH) and any other suitable type of measuring unit that provides a suitable concentration of the oxidant within the plating solution 31 is utilized, and all such types are fully intended to be included within the scope of the embodiments.

In addition, for measurements that are desired below the sensitivity levels of the intensity unit 153 (e.g., below 100 ppm), the first analysis unit 117 also includes a spectrum analysis unit 155. The spectrum analysis unit 155 is an optical spectrum analysis unit, in which the sample of the plating solution 31 is irradiated with ultraviolet (UV) light, near-infra red (NIR) light, or infra-red (IR) light, and a resulting absorption spectrum is analyzed to determine the concentration of the oxidant within the samples of the plating solution 31.

The spectrum analysis unit 155 measures the concentration of other components that are within the plating solution 31. For example, the spectrum analysis unit 155 measures the concentration of reaction by-products, such as silicate, that is within the plating solution 31. This and any other analysis for which the spectrum analysis unit 155 is suitable are also utilized to provide information on the plating solution 31.

The second analysis unit 119 measures the concentration of the surfactant within the samples of the plating solution 31. The second analysis unit 119 is a spectrum analysis unit, and is an optical spectrum analysis unit, in which the samples of the plating solution 31 are irradiated with, e.g., ultraviolet (UV) light and a resulting absorption spectrum is analyzed to determine the concentration of the surfactant within the samples of the plating solution 31. In some embodiments, the second analysis unit 119 is the spectrum analysis unit 155 as described above with respect to the first analysis unit 117, although the second analysis unit 119 may have a separate spectrum analysis unit. Additionally, any suitable analysis unit may alternatively be utilized to measure the concentration of the surfactant within the samples of the plating solution 31.

The third analysis unit 151 measures the concentration of the strong base within the samples of the plating solution 31. In some embodiments when the strong base is KOH, the third analysis unit 151 is a pH meter to determine the concentration of KOH in the plating solution 31. However, any other suitable measurement system, such as a refractometer, may alternatively be utilized to measure the concentration of the strong base within the plating solution 31.

Figure 2:
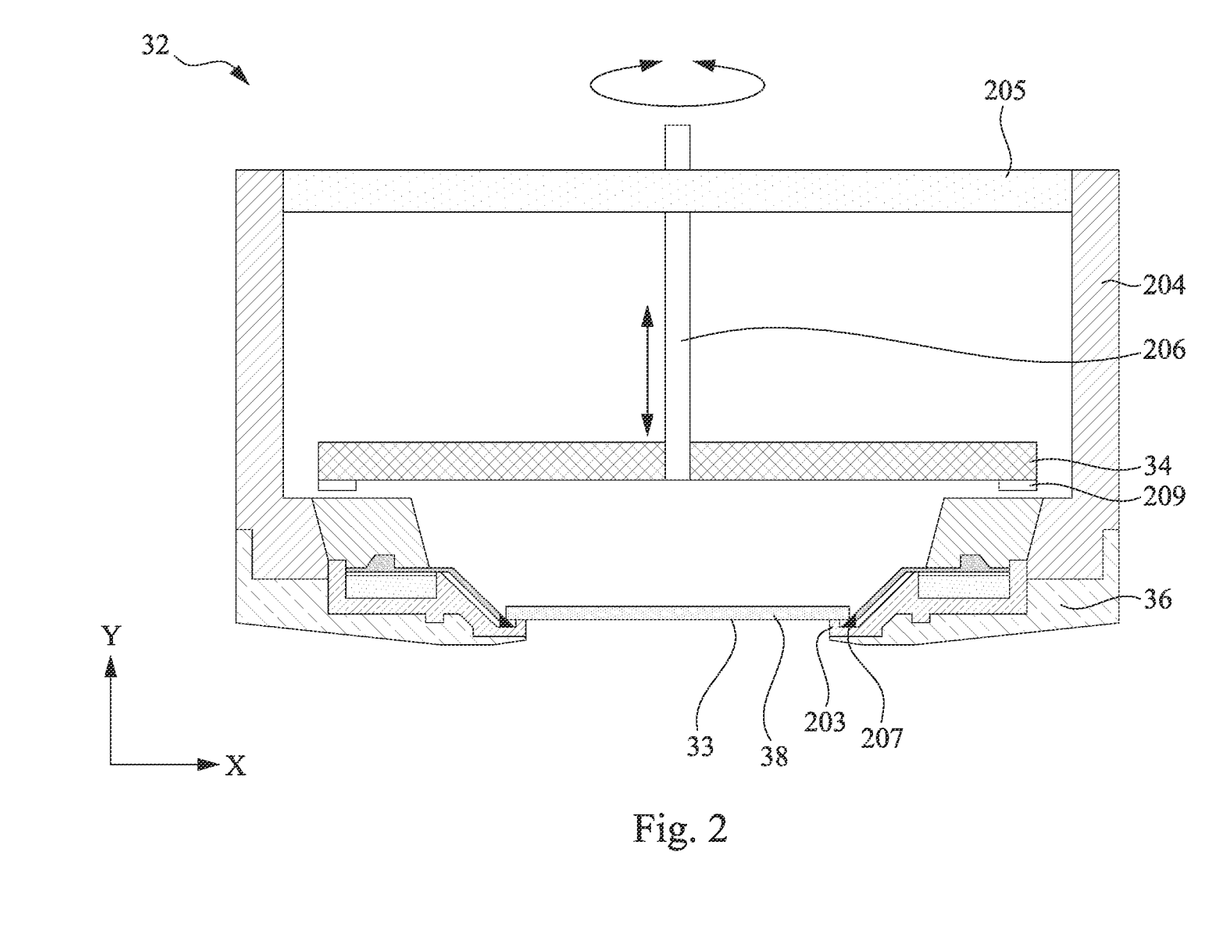
FIG. 2. illustrates a cross-sectional schematic of the substrate holder including the cone and the cup.

FIG. 2 illustrates a cross-sectional schematic of the substrate holder 32 including the cone 34 and the cup 36. The cup 36 is supported by top plate 205 using struts 204. Generally, the cup 36 provides a support upon which substrate 38 rests. The cup 36 includes an opening through which plating solution 31 contacts the substrate 38 positioned at the opening. Note that substrate 38 has a front/working side 33, on which the plating occurs. The periphery of substrate 38 rests on a sealing element 203 (e.g., an O-ring, a lip seal, etc.) positioned on the bottom portion of the cup 36. One or more snubbers 207 (e.g., mechanical snubbers) also located on the bottom portion of the cup 36 limit the movement of the substrate 38 due to, for example, the movement of the plating solution 31, during submersion of the substrate holder 32 into the plating solution 31 and/or during the plating process Referring to FIG. 2, the substrate 38 is loaded into the substrate holder 32 by lifting cone 34 from its depicted position via spindle 206. When cone 34 is lifted, a gap is created between cup 36 and cone 34 into which substrate 38 can be inserted. As discussed below, the substrate 38 is inserted into the substrate holder 32 using robotic arms. The cone 34 is then lowered to engage substrate 38 against the periphery of cup 36 or, more specifically, against the snubbers 207 and the sealing element 203.

The spindle 206 is used to rotate the substrate holder 32 and the substrate 38 during electroplating, drying, and other operations. The sealing element 203 forms a fluid tight seal that limits the plating solution 31 (see, FIGS. 1A and 1B) from contacting the backside of substrate 38 (where the plating solution could introduce contaminating metal atoms onto/into the silicon substrate) and from reaching other components of substrate holder 32. The cone 34 also includes sealing elements 209 located near the outer edge of cone 34 and an upper region of the cup 36 when engaged. This arrangement also protects the backside of substrate 38 from plating solution 31 that might enter the clamshell from above the cup 36. The sealing elements 209 may be affixed to the cone 34 or the cup 36, and may be a single sealing element or a multi-component sealing element. Upon initiation of plating, substrate 38 is introduced to cup 36 when cone 34 is raised above cup 36. When the substrate is initially introduced into cup 36, typically by a robotic arm, its front side 33 rests on sealing element 203. During plating, the substrate holder 32 rotates in order to achieve uniform plating.

As mentioned above, the substrate 38 is provided to the wafer engaging components, also referred to as "clamshell" components. The clamshell includes the cup 36 and the cone 34 that is disposed on the cup 36. Substrates that are to be processed are generally provided to the plating apparatus via robots (e.g., front end and back end robots) and inserted into the clamshell of the plating apparatus using robots as well. It is required that the substrate is positioned substantially horizontal (e.g., angled+/−5° (or less) to the ideal horizontal axis) when placed in the cup. One way of ensuring this is by visual inspection by the operator. However, it is difficult to determine whether the substrate is substantially horizontal by visual inspection since changes in inclination of the substrate are not readily apparent to the human eye. An incorrectly positioned substrate may cause improper sealing between the sealing element and the substrate. The improper sealing may cause the plating solution to flow across the sealing element and contact the back side of substrate. It is therefore desirable to ensure substantial horizontal placement of the substrate with a high level of accuracy. As used herein, inclination of the substrate, or equivalents thereof, refers to the angle between the substrate and the ideal horizontal axis (X-axis), which is equivalent to the surface of the plating solution in a static state.

According to embodiments, an optical measurement technique using, for example, lasers, is used to determine whether the substrate is placed substantially horizontal in the cup. The lasers are produced by a plurality of distance measuring devices placed underneath the cone, for example, on the lower surface of the cone facing the cup. Each distance measuring device generates laser pulses that are bounced off the back side (top surface) of substrate. The turnaround time (TAT) required for each laser pulse to return to the corresponding generator is measured. The turnaround time is measured from the time the laser pulse is emitted from the generator to the time the pulse is detected back at the generator after reflecting from the substrate, more specifically, from the back side of the substrate. The distance between the distance measuring device and the back side of the substrate is obtained from the turnaround time. The turnaround time is measured for laser pulses generated by each distance measuring device and the corresponding distances between each distance measuring device and the back side of the substrate are obtained. If the distances are within a desired proximity of each other, it is determined that the substrate is positioned substantially horizontal in the cup. If the distances are not within the desired proximity, then it is determined that the substrate is placed inclined in the cup. The substrate is then repositioned. A robotic arm will reengage the substrate, lift the substrate, and place it again in the cup. The distances are measured again until a desired proximity is obtained, thereby indicating that the substrate is positioned substantially horizontal in the cup. Although embodiments are directed to ensuring that the substrate is placed substantially horizontal in the cup, embodiments are not limited in this regard. Embodiments of the disclosure can equally be used to determine if the substrate has been placed with a desired inclination (not substantially horizontal) in the cup, without departing from the spirit and scope of the disclosure.

Figure 3:
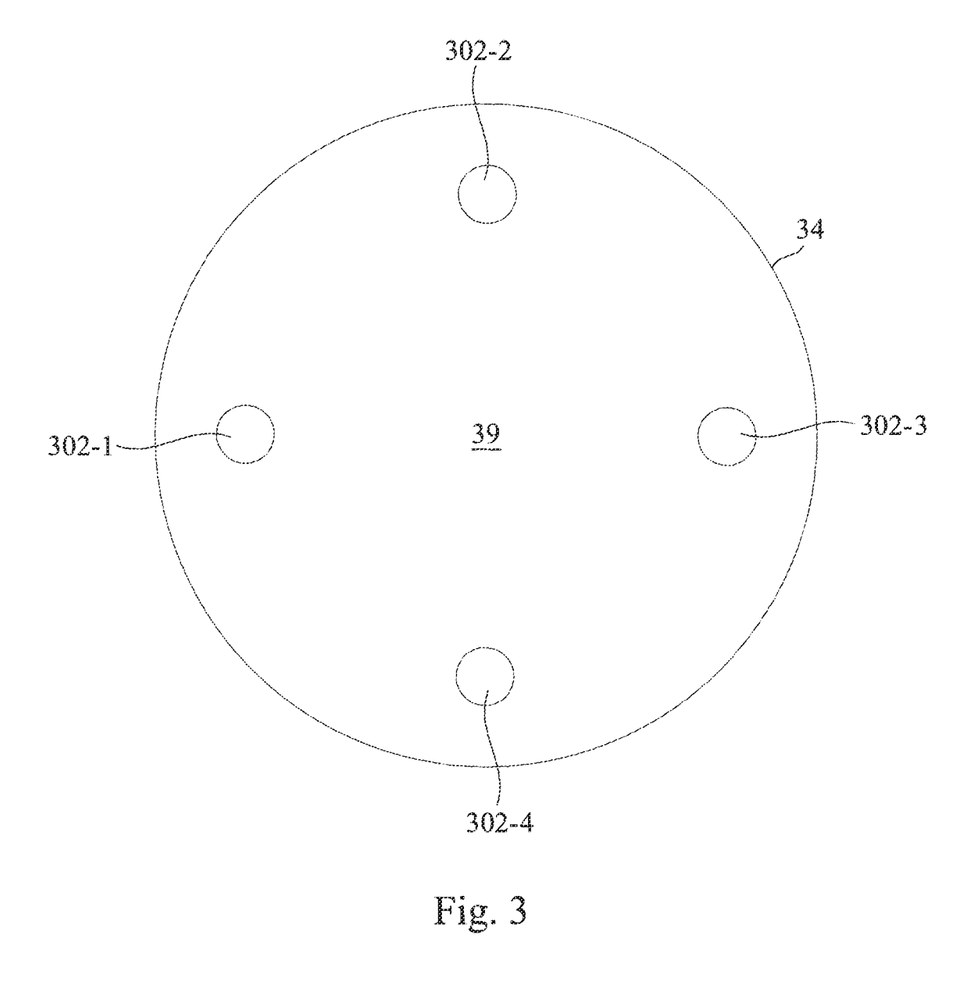
FIG. 3 is a schematic plan view of the lower surface of the cone including a plurality of distance measuring devices, according to embodiments of the disclosure.

FIG. 3 is a schematic plan view of the lower surface of the cone 34 including a plurality of distance measuring devices 302-1, 302-2, 302-3, and 302-4 (collectively referred to distance measuring devices 302), according to embodiments of the disclosure. As illustrated, the plurality of distance measuring devices 302 are positioned at a 90° angular separation from each other. The plurality of distance measuring devices 302 are positioned in an area on the lower surface 39 of the cone 34 that is directly above the substrate 38 when the substrate 38 is placed in the cup 36 and the cone 34 is closed. Although FIG. 3 illustrates 4 distance measuring devices 302, the number of distance measuring devices is not limited in this regard. Similarly, the arrangement of the distance measuring devices 302 is not limited to the arrangement illustrated in FIG. 3. The cone 34 can include three distance measuring devices or more than 4 distance measuring devices positioned in any desired configuration on the lower surface 39 provided the laser pulses from these distance measuring device are emitted substantially perpendicular to the lower surface 39 and the return laser pulses are received by the corresponding distance measuring device 302. For example, in another embodiment, three distance measuring devices 302 are placed on the lower surface 39, each separated at 120° angular separation from an adjacent distance measuring device 302.

Figure 4:
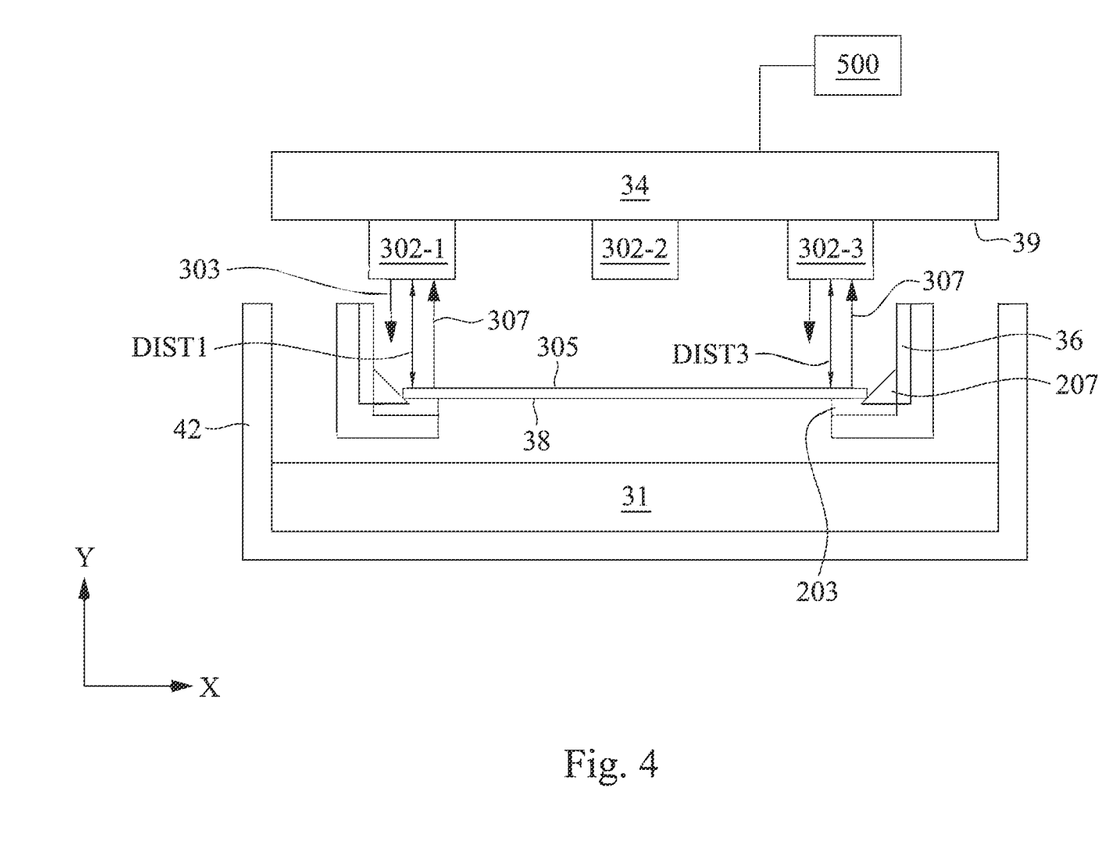
FIG. 4 illustrates the setup with the substrate placed in the cup and the cone positioned over the cup prior to closing the clamshell.

FIG. 4 illustrates the setup with the substrate 38 placed in the cup 36 and the cone 34 positioned over the cup 36 prior to closing the clamshell. As illustrated, a plurality of distance measuring devices 302 (similar to FIG. 3) are installed on the lower surface 39 of the cone 34. After the substrate 38 has been placed in the cup 36, the cone 34 is positioned over the cup 36 to check the inclination of the substrate 38 to determine whether the substrate 38 is positioned substantially horizontal in the cup 36. In order to check the inclination, the distance measuring devices 302 emit laser pulses 303 towards the substrate 38. In an embodiment, the distance measuring devices 302 emit the laser pulses sequentially or in a desired order. In another embodiment, the plurality of distance measuring devices 302 emit the laser pulses simultaneously or near simultaneously (having very small delay between laser pulses generated by the distance measuring devices). For the sake of discussion, embodiments disclosed consider that the measurements using the distance measuring devices 302 are performed when the substrate 38 is outside the plating solution 31. However, embodiments are not limited in this regard. In other embodiments, the measurements using the distance measuring devices 302 can also be performed when the substrate 38 is immersed in the plating solution 31 and/or while electroplating operations are being performed on the substrate 38, without departing from the spirit and scope of the disclosure.

Each distance measuring device 302 emits the respective laser pulse 303 towards the substrate 38. The laser pulse is generated when optical energy (light) from the distance measuring device 302 is emitted not in continuous mode, but in short bursts (pulses) of some duration at some repetition rate. For the purposes of discussion, it is assumed that each distance measuring device 302 emits a single laser pulse 303, receives the reflected laser pulse 307 from the substrate 38, and calculates the turnaround time (TAT) and distance (discussed below) before emitting the next laser pulse. In an example, this can be achieved by increasing the repetition rate between two successive pulses or by stopping pulse generation by the distance measuring device 302 after a single laser pulse has been emitted. However, in other embodiments, the distance measuring devices 302 can emit a series of pulses and perform measurements based on the series of pulses reflected from the substrate 38.

The laser pulse 303 strikes (impinges upon) the back side (top surface) 305 of substrate 38 and is reflected back (reflected pulse 307) to the distance measuring device 302. The distance measuring device 302 calculates the time it takes for the reflected laser pulse 307 to be received. This time, also referred to as turnaround time (TAT), is calculated by measuring the duration from the time the laser pulse 303 is emitted by the distance measuring device 302 and the time the reflected laser pulse 307 is received by the distance measuring device 302. In other embodiments, the distance measuring device 302 transmits a first signal (command) to an external controller (e.g., computing system 500, FIGS. 5A and 5B) when the laser pulse 303 has been emitted and a second signal (command) when the reflected laser pulse 307 has been received. When the first signal is received, the controller starts a timer and when the second signal is received, the controller stops the timer. The turnaround time is thereby obtained using the timer. It should be noted that the reflected laser pulse 307 and the laser pulse 303 are substantially the same laser pulse. The different labels are provided for the sake of explanation to differentiate between an emitted (transmitted) laser pulse and a reflected laser pulse.

In some embodiments, based on the respectively calculated turnaround times, each distance measuring device 302 calculates a corresponding distance between the distance measuring device 302 and the substrate 38. The logic (software or hardware) for calculating the distance from the turnaround time is included in the distance measuring device 302, and the distance measuring device 302 provides the calculated distance to the controller for indicating (e.g., displaying on a display 504, FIG. 5A) the same to the operator. In other embodiments, the logic (software or circuit) for calculating the distance from the turnaround time is included in the controller 500. In this case, the distance measuring devices 302 transmit the turnaround time to the controller 500 and the controller 500 provides the operator with the calculated distance.

Differences between the distances calculated by the distance measuring devices 302 is calculated. If the difference is substantially zero (+/−0.5 mm) or within a desired threshold value, then it is determined that the substrate 38 is horizontal. However, if the difference is not substantially zero or is not within a desired threshold value, then it is determined that the substrate 38 is not horizontal.

Depending on the distances measured by the distance measuring devices 302, a direction of the inclination (e.g., tilt) can be determined. In other words, it can be determined, which portion (end) of the substrate 38 is lower than the other portions of the substrate 38. Alternatively, it can be determined which portion of the substrate 38 is higher than the other portions of the substrate 38. For example, referring to FIG. 4, if the distance (referred to DIST1, for example) between distance measuring device 302-1 and the substrate 38 is larger than the distance (referred to DIST3, for example) between distance measuring device 302-3 and the substrate 38, then it can be determined that the portion of the substrate 38 below the distance measuring device 302-3 is positioned higher than the portion of the substrate 38 below the distance measuring device 302-1. In other words, the substrate 38 is sloping downward from the distance measuring device 302-3 to the distance measuring device 302-1. To reposition the substrate 38, the robotic arm engages the substrate 38 to lift the substrate 38, and repositions the substrate 38 such that the portion of the substrate 38 below the distance measuring device 302-1 is higher than the portion of the substrate 38 below the distance measuring device 302-3. The distances from the distance measuring devices 302 and the repositioned substrate 38 are measured again to determine whether the substrate 38 is substantially horizontal.

In some embodiments, each distance measuring device 302 is also programmed (via software or hardware circuit) or otherwise configured to implement a timeout condition in which each distance measuring device 302 waits for a certain amount of time to receive the reflected laser pulse 307. If the reflected laser pulse 307 is not received with the amount of time (i.e., the time limit is exceeded), a timeout is declared and the operator is notified (e.g., a notification on a display 504 in FIG. 5A). The timeout may indicate that the substrate 38 is severely inclined such that the reflected laser pulse 307 does not bounce back to the distance measuring device 302 from which it was emitted. This may be indicative that the robotic arm has malfunctioned and is incapable of handling the substrate as intended. The operator can then perform the necessary remedial actions on the robotic arm. Alternatively, it may be indicative of other apparatus malfunctions or other errors, and the necessary remedial actions are performed. After the appropriate corrective action has been taken, the process to determine whether the substrate 38 is horizontal is repeated. Once it is determined that the substrate 38 is substantially horizontally positioned in the cup 36, the cone 34 is closed and the plating operation begins.

Figure 5A:
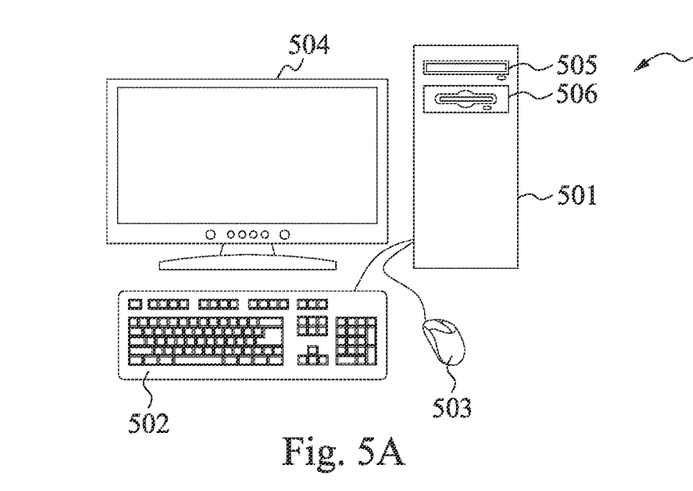
FIGS. 5A and 5B show a data analyzing apparatus according to an embodiment of the present disclosure.

FIG. 5A is a schematic view of a computer system that operates as a controller for controlling operations of the distance measuring devices 302, calculates the distances from the turnaround times, and/or control the plating operations. The foregoing embodiments may be realized using computer hardware and computer programs executed thereon. In FIG. 5A, a computer system 500 is provided with a computer 501 including an optical disk read only memory (e.g., CD-ROM or DVD-ROM) drive 505 and a magnetic disk drive 506, a keyboard 502, a mouse 503, and a display 504.

Figure 5B:
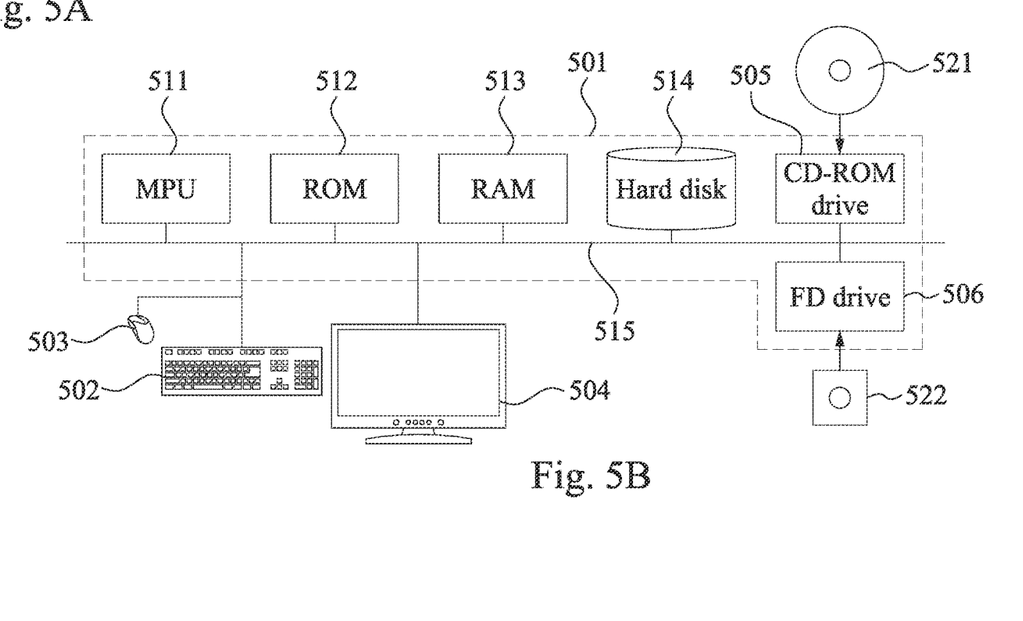

FIG. 5B is a diagram showing an internal configuration of the computer system 500. In FIG. 5B, the computer 501 is provided with, in addition to the optical disk drive 505 and the magnetic disk drive 506, one or more processors 511, such as a micro processing unit (MPU), a ROM 512 in which a program such as a boot up program is stored, a random access memory (RAM) 513 that is connected to the MPU 511 and in which a command of an application program is temporarily stored and a temporary storage area is provided, a hard disk 514 in which an application program, a system program, and data are stored, and a bus 515 that connects the MPU 511, the ROM 512, and the like. Note that the computer 501 may include a network card (not shown) for providing a connection to a LAN.

The program for causing the computer system 500 to execute the operations discussed in the foregoing embodiments may be stored in an optical disk 521 or a magnetic disk 522, which are inserted into the optical disk drive 505 or the magnetic disk drive 506, and be transmitted to the hard disk 514. Alternatively, the program may be transmitted via a network (not shown) to the computer 501 and stored in the hard disk 514. At the time of execution, the program is loaded into the RAM 513. The program may be loaded from the optical disk 521 or the magnetic disk 522, or directly from a network.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs. Furthermore, a computer that executes the programs may be a single computer or may be multiple computers.

In some embodiments, the distance measurement using lasers is performed by using a laser interferometer technique. In other embodiments, the distance measurement is performed by using ultrasound, sonar, echo sounding, etc. In still other embodiments, the distance measurement is performed using Doppler devices that measure the distance using Doppler technique, magnetic sensors (magnetic encoders), rotary encoders, etc.

In some embodiments, the distance measurement is performed even after the clamshell is closed. In such a case, the distance measurement is also performed during an electroplating process and the position of the substrate may be adjusted during the electroplating process to maintain parallel position with respect to the surface of the plating solution. In other embodiments, when the inclination of substrate exceeds a threshold, an alarm is output. In still other embodiments, if the inclination of the substrate exceeds a threshold during a plating operation, an alarm is output.

Embodiments of the present disclosure are directed to ensuring that the substrate placed in the clamshell for performing the plating operation is substantially horizontal in the cup of the clamshell. This improves the plating of the substrate and limits the plating solution from contacting the backside of the substrate.

It will be understood that not all advantages have been necessarily discussed herein, no particular advantage is required for all embodiments or examples, and other embodiments or examples may offer different advantages.

According to one aspect of the present disclosure, an apparatus includes a cup configured to support a substrate; and a cone including at least three distance measuring devices arranged on a lower surface thereof and facing the substrate. Each distance measuring device is configured to transmit a laser pulse towards the substrate, the laser pulse impinging the substrate, receive a reflected laser pulse from the substrate, calculate a turnaround time of the laser pulse, and calculate a distance between the distance measuring device and the substrate using the turnaround time for determining an inclination of the substrate. In an embodiment, the distance measuring devices transmit the laser pulses simultaneously. In an embodiment, the distance measuring devices transmit the laser pulses at different times. In an embodiment, the distance measuring devices transmit the laser pulses sequentially. In an embodiment, the distance measuring devices are directly above the substrate. In an embodiment, the distance measuring device is configured to calculate the distance between the distance measuring device and the substrate for determining whether the substrate is placed substantially horizontal in the cone.

According to another aspect of the present disclosure, a method includes placing a substrate in a cup of a substrate holder; positioning a cone over the substrate, a cone including at least three distance measuring devices arranged on a lower surface thereof and facing the substrate; transmitting laser pulses using each of the at least three distance measuring devices towards the substrate, the laser pulses impinging the substrate; receiving reflected laser pulses from the substrate at each of the at least three distance measuring devices; calculating a turnaround time for each laser pulse using a corresponding distance measuring device; calculating, using the corresponding distance measuring device, a distance between the distance measuring device and the substrate, the distance being calculated using the turnaround time; and determining an inclination of the substrate. In an embodiment, determining the inclination of the substrate includes determining whether the substrate is substantially horizontal. In an embodiment, the method further includes repositioning the substrate when it is determined that the substrate is not substantially horizontal. In an embodiment, the method further includes determining the inclination of the substrate after repositioning the substrate. In an embodiment, the method further includes performing a plating operation on the substrate after determining the inclination of the substrate. In an embodiment, the distance measuring devices transmit the laser pulses simultaneously. In an embodiment, wherein the distance measuring devices transmit the laser pulses at different times. In an embodiment, wherein the distance measuring devices transmit the laser pulses sequentially. In an embodiment, wherein positioning the cone over the substrate comprises positioning the cone over the substrate such that the at least three distance measuring devices are directly above the substrate.

According to an aspect of the present disclosure, a system for electrochemically plating a substrate includes an electroplating cell containing an plating solution for electrochemically depositing a metal on the substrate; a substrate holder configured to holding the substrate in the plating solution; an anode immersed in the plating solution; and a power supply electrically coupled between the anode and the substrate holder. The substrate holder includes a cup configured to hold the substrate, and a cone including a plurality of distance measuring devices arranged on a lower surface thereof and facing the substrate, and having an equal angular separation from each other. Each distance measuring device is configured to transmit a laser pulse towards the substrate, the laser pulse impinging the substrate, receive a reflected laser pulse from the substrate, calculate a turnaround time of the laser pulse, and calculate a distance between the distance measuring device and the substrate using the turnaround time for determining an inclination of the substrate. In an embodiment, wherein each distance measuring device is configured to calculate the distance to determine whether the substrate is substantially horizontal. In an embodiment, wherein the cone is positioned over the substrate such that the plurality of distance measuring devices are directly above the substrate. In an embodiment, the system further includes a controller programmed to determine the inclination of the substrate using the distance calculated using the plurality of distance measuring devices. In an embodiment, the controller is programmed to perform a plating operation on the substrate after determining that the substrate is substantially horizontal.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
    an electroplating cell configured to retain a plating solution;
    a cup configured to support a substrate, the substrate comprising a front side for electroplating and a back side opposite the front side, the cup configured to support the substrate with the front side of the substrate facing the plating solution; and
    a cone including at least three distance measuring devices arranged on a lower surface thereof and configured to be directly above the substrate and face the back side of the substrate, wherein each of the distance measuring devices is configured to
        transmit a laser pulse to impinge upon the back side of the substrate,
        receive a reflected laser pulse from the back side of the substrate,
        calculate a turnaround time of the laser pulse,
        calculate a distance between each of the distance measuring devices and the back side of the substrate using the turnaround time for determining an inclination of the substrate, and
        determine whether differences between the distances calculated by each of the distance measuring devices are within a desired threshold value.

2. The apparatus of claim 1, wherein each of the distance measuring devices is configured to transmit the laser pulse simultaneously.

3. The apparatus of claim 1, wherein each of the distance measuring devices is configured to transmit the laser pulse at different times.

4. The apparatus of claim 1, wherein each of the distance measuring devices is configured to transmit the laser pulse sequentially.

5. The apparatus of claim 1, wherein each distance measuring device is configured to calculate the distance between the distance measuring device and the back side of the substrate for determining whether the substrate is placed substantially horizontal in the cone.

6. The apparatus of claim 1, further comprising a sealing element positioned between the cup and the cone.

7. A system for electrochemically plating a substrate, comprising:
    an electroplating cell configured to contain a plating solution for electrochemically depositing a metal on the substrate, the substrate comprising a front side and a back side opposite the front side;
    a substrate holder configured to hold the substrate in the plating solution;
    an anode configured to be immersed in the plating solution; and
    a power supply electrically coupled between the anode and the substrate holder, wherein the substrate holder includes,
        a cup configured to hold the front side of the substrate in the plating solution, and
        a cone including a plurality of distance measuring devices arranged on a lower surface thereof and having an equal angular separation from each other, the cone being configured to be positioned over the substrate such that the plurality of distance measuring devices are directly above the substrate and face a back side of the substrate, wherein each of the distance measuring devices is configured to
            transmit a laser pulse to impinge upon the back side of the substrate,
            receive a reflected laser pulse from the back side of the substrate,
            calculate a turnaround time of the laser pulse,
            calculate a distance between the distance measuring device and the back side of the substrate using the turnaround time for determining an inclination of the substrate, and
            determine whether differences between the distances calculated by each of the distance measuring devices are within a desired threshold value.

8. The system of claim 7, wherein each of the distance measuring devices is configured to calculate the distance to determine whether the substrate is substantially horizontal.

9. The system of claim 7, further comprising a controller programmed to determine the inclination of the substrate using the distance calculated using the plurality of distance measuring devices.

10. The system of claim 9, wherein the controller is programmed to perform a plating operation on the substrate after determining that the substrate is substantially horizontal.

11. The system of claim 7, further comprising a spindle configured to rotate the substrate holder during electroplating of the substrate.

12. An apparatus, comprising:
    an electroplating cell configured to retain a plating solution;
    a cup configured to support a substrate, the substrate comprising a front side for electroplating and a back side opposite the front side, the cup configured to support the substrate with the front side of the substrate facing the plating solution;
    a cone positioned over the cup and including at least three distance measuring devices arranged on a lower surface thereof and configured to be directly above the substrate and face the back side of the substrate; and
    a controller coupled to each of the at least three distance measuring devices, wherein
        each of the distance measuring devices is configured to transmit a laser pulse to impinge upon the back side of the substrate, and receive a reflected laser pulse from the back side of the substrate, and the controller is configured to start a timer corresponding to each distance measuring device when the laser pulse is transmitted from the distance measuring device, stop the timer when the reflected laser pulse is received by the distance measuring device, calculate, using the corresponding distance measuring device, a distance between each of the distance measuring devices and the back side of the substrate based on a time obtained from each corresponding timer, and determine an inclination of the substrate using the calculated distances to reposition the inclination of the substrate when differences between the calculated distances are not within a desired threshold value.

13. The apparatus of claim 12, wherein the controller is further configured to determine the inclination of the substrate after repositioning the substrate.

14. The apparatus of claim 12, further comprising a sealing element positioned between the substrate and the cup.

15. The apparatus of claim 12, wherein each of the at least three distance measuring devices is configured to transmit the laser pulse simultaneously.

16. The apparatus of claim 12, wherein each of the at least three distance measuring devices is configured to transmit the laser pulse at different times.

17. The apparatus of claim 12, wherein each of the at least three distance measuring devices is configured to transmit the laser pulse sequentially.

18. The apparatus of claim 12, wherein the controller is configured to determine whether the substrate is substantially horizontal by determining the inclination of the substrate.

19. The apparatus of claim 12, wherein the controller is configured to determine whether the inclination of the substrate is outside a desired range of inclination values.

20. The apparatus of claim 12, wherein the cup comprises one or more snubbers configured to limit movement of the substrate within the cup.

* * * * *